United States Patent
Zhao

(10) Patent No.: US 11,158,541 B2
(45) Date of Patent: Oct. 26, 2021

(54) METHOD OF PROCESSING WAFER

(71) Applicant: DISCO CORPORATION, Tokyo (JP)

(72) Inventor: Jinyan Zhao, Tokyo (JP)

(73) Assignee: DISCO CORPORATION, Tokyo (JP)

(*) Notice: Subject to any disclaimer, the term of this patent is extended or adjusted under 35 U.S.C. 154(b) by 117 days.

(21) Appl. No.: 16/388,137

(22) Filed: Apr. 18, 2019

(65) Prior Publication Data

US 2019/0326174 A1 Oct. 24, 2019

(30) Foreign Application Priority Data

Apr. 20, 2018 (JP) .............................. JP2018-081078

(51) Int. Cl.
*H01L 21/78* (2006.01)
*H01L 21/304* (2006.01)
*H01L 21/67* (2006.01)

(52) U.S. Cl.
CPC ............ *H01L 21/78* (2013.01); *H01L 21/304* (2013.01); *H01L 21/67092* (2013.01)

(58) Field of Classification Search
CPC .................. H01L 21/78; H01L 21/6836; H01L 21/67092; H01L 2221/68327; H01L 21/67132

See application file for complete search history.

(56) References Cited

U.S. PATENT DOCUMENTS

2007/0164073 A1* 7/2007 Watanabe ............ B28D 5/0011
225/96.5

FOREIGN PATENT DOCUMENTS

JP   2006108273 A   4/2006
JP   2012146744 A   8/2012

* cited by examiner

*Primary Examiner* — Tony Tran

(74) *Attorney, Agent, or Firm* — Greer, Burns & Crain, Ltd.

(57) ABSTRACT

A method of processing a wafer with a metal film to divide the wafer into individual device chips along a grid of projected dicing lines where the mechanical strength of the wafer is reduced. The method includes the steps of sticking a holding tape to a face side of the wafer, holding the wafer while a reverse side of the wafer with the metal film thereon is being exposed, and drawing the wafer under suction along the projected dicing lines to fracture the wafer along the projected dicing lines while the reverse side of the wafer is being cooled in its entirety.

8 Claims, 4 Drawing Sheets

METHOD OF PROCESSING WAFER

BACKGROUND OF THE INVENTION

Field of the Invention

The present invention relates to a method of processing a wafer to divide the wafer into a plurality of device chips.

Description of the Related Art

There has been proposed a method of dividing a wafer such as a semiconductor wafer or the like by forming severance initiating points with reduced mechanical strength in the wafer along projected dicing lines thereon and applying an external force to the wafer to separate the wafer into a plurality of device chips along the projected dicing lines. The external force may be applied in various ways. For example, if a wafer with a small chip size, or a wafer with a large thickness, or a wafer with a relatively large hardness is to be divided, then it is customary to divide the wafer by locally pressing the wafer or pulling down the wafer under suction along the projected dicing lines (see, for example, Japanese Patent Laid-Open No. 2012-146744 and Japanese Patent Laid-Open No. 2006-108273). As an external force is applied intensively to the severance initiating points with reduced mechanical strength, the wafer referred to above can be divided into individual device chips.

SUMMARY OF THE INVENTION

Some wafers have a metal film from which to produce electrodes on devices and some wafers have a metal film from which to produce reflective films on devices. Since a metal film is ductile or tenacious, when a wafer with such a metal film is divided by one of the methods referred to above, the metal film may be elongated and remain unbroken, or may be broken but produce large burrs that tend to make devices on the wafer defective.

It is therefore an object of the present invention to provide a method of processing a wafer with a metal film without making devices on the wafer defective.

In accordance with an aspect of the present invention to provide a method of processing a wafer to divide the wafer into individual device chips along a grid of projected dicing lines on a face side of the wafer with a metal film on a reverse side thereof, the wafer having a reduced mechanical strength along the projected dicing lines. The method includes the steps of sticking a holding tape to a lower surface of the wafer which is either the face side or the reverse side thereof, the wafer having an upper surface which is either the reverse side or the face side thereof (tape sticking step), holding the wafer with the holding tape stuck thereto, along the projecting dicing lines (wafer holding step), and drawing the wafer held by the holding tape under suction along the projected dicing lines to fracture the wafer along the projected dicing lines (wafer fracturing step). The wafer is fractured while contact cooling means having a contact surface contacting the upper surface of the wafer in its entirety and a cooling unit cooling the contact surface to or below 0° C. is being held in contact with the upper surface of the wafer.

With this arrangement, since the entire upper surface of the wafer is efficiently cooled by the contact surface of the contact cooling means, the metal film loses its ductility and develops low-temperature brittleness. The metal film can thus easily be fractured by an external force applied thereto. When a suction force is applied to the projected dicing lines where the mechanical strength of the wafer is reduced, the wafer with the metal film can be divided into individual device chips without causing the metal film to produce burrs and hence without making the devices on the device chips defective.

According to the present invention, the wafer with the metal film can be divided into individual device chips without making the devices on the device chips defective by cooling the entire reverse side of the wafer to or below 0° C. while dividing the wafer.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
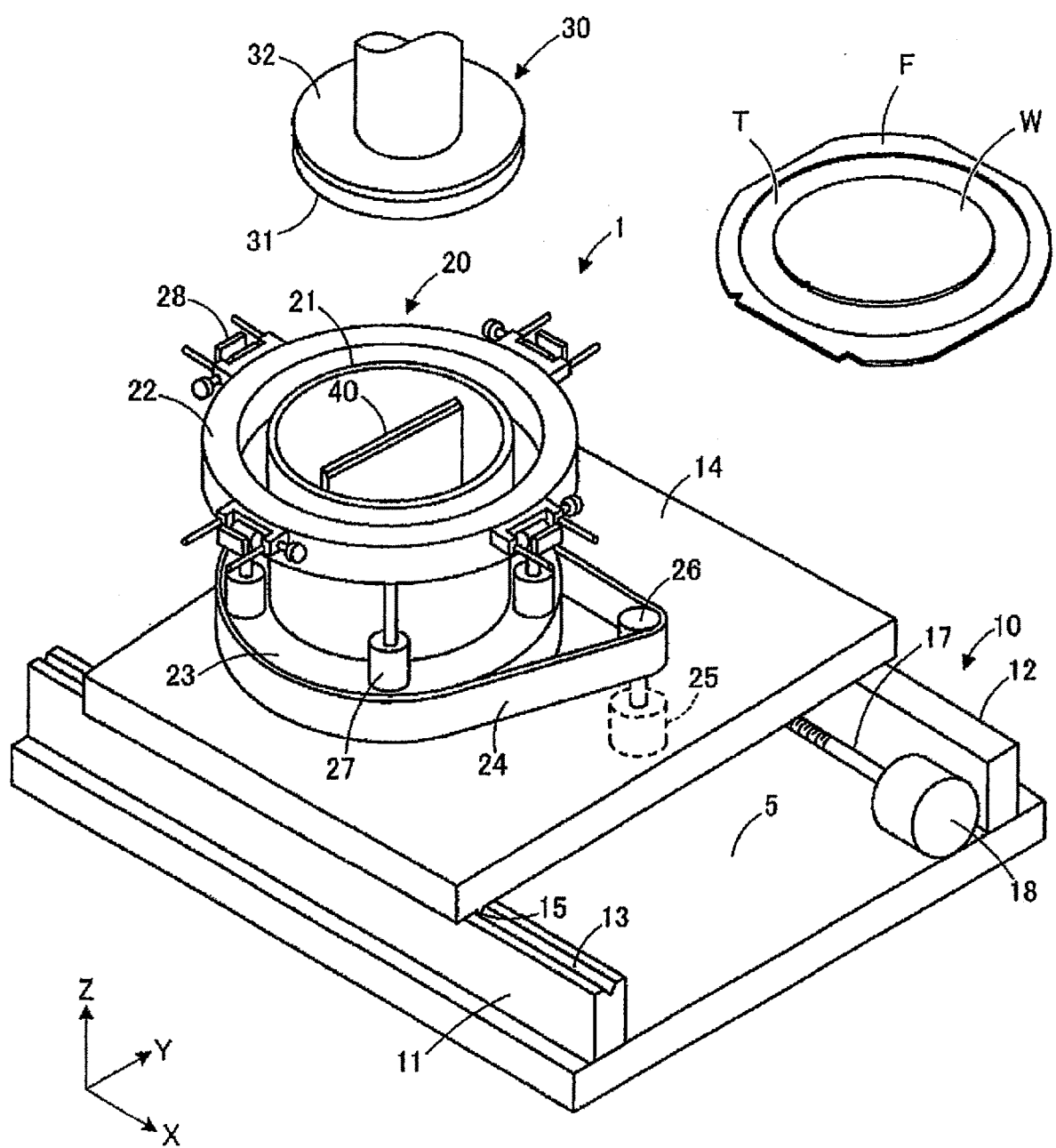
FIG. 1 is a perspective view of a wafer dividing apparatus for carrying out a method of processing a wafer according to an embodiment of the present invention.
Figure 2:
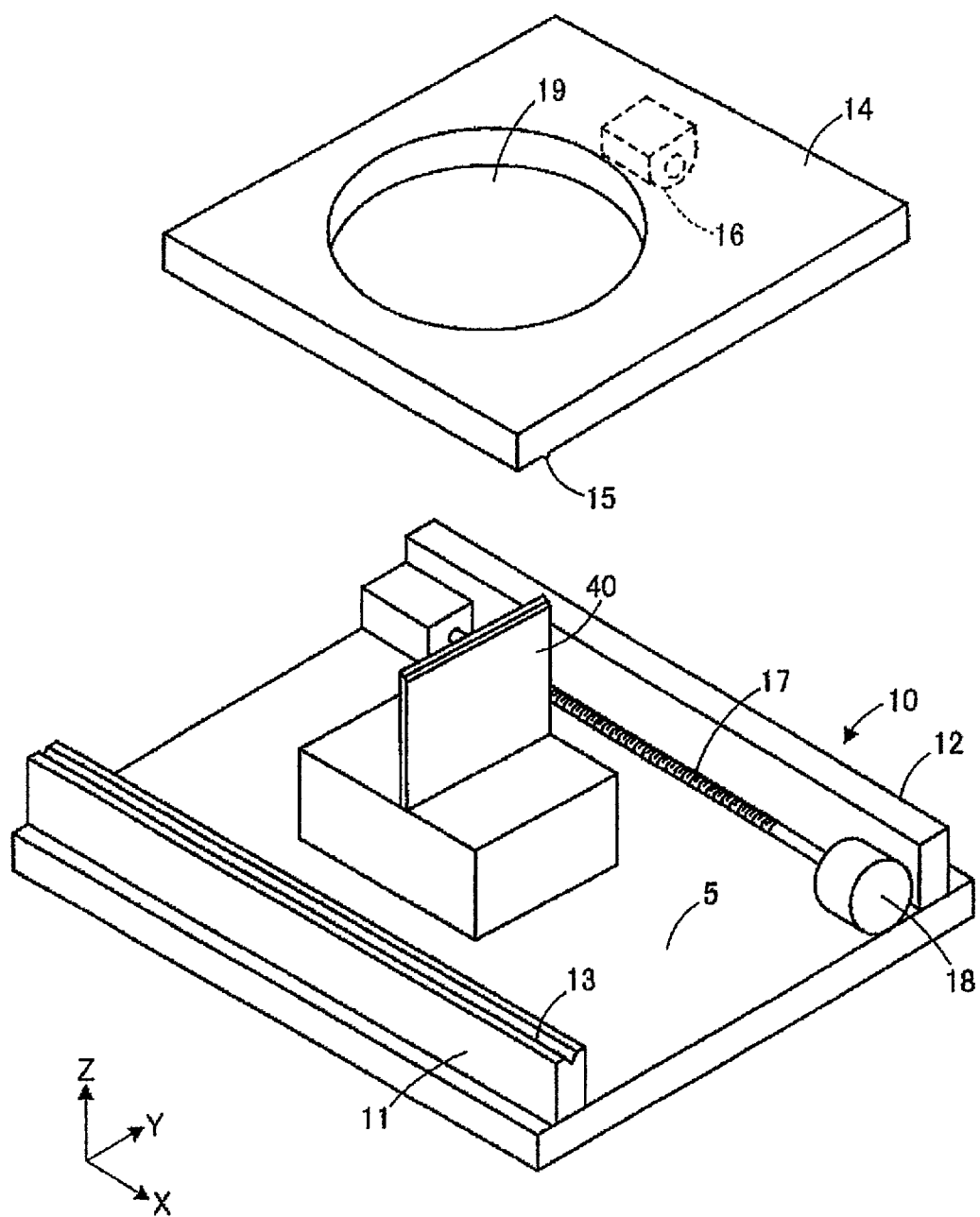
FIG. 2 is an exploded perspective view of a portion of the wafer dividing apparatus illustrated in FIG. 1.

A wafer dividing apparatus for carrying out a method of processing a wafer, or a wafer processing method, according to an embodiment of the present invention will be described in detail below with reference to the accompanying drawings. FIG. 1 is a perspective view of the wafer dividing apparatus according to the present embodiment. FIG. 2 is an exploded perspective view of a portion of the wafer dividing apparatus illustrated in FIG. 1. The wafer dividing apparatus illustrated in FIGS. 1 and 2 is by way of example only, and may be changed or modified.

As illustrated in FIG. 1, a wafer dividing apparatus, denoted by 1, is arranged to divide a wafer W held on a holding table 20 into individual device chips along a grid of projected dicing lines on the wafer W by applying suction forces to the projected dicing lines where the mechanical strength of the wafer W is reduced. The projected dicing lines that are formed on a face side of the wafer W demarcate the face side of the wafer W into a plurality of areas where devices are formed. A holding tape T is stuck to the face side of the wafer W and has an outer peripheral edge portion that is stuck to a ring frame F such that the wafer W is positioned in a circular central opening defined in the ring frame F. The wafer W that is supported on the ring frame F by the holding tape T is loaded into the wafer dividing apparatus 1.

As illustrated in FIGS. 1 and 2, the wafer dividing apparatus 1 includes a base 5 supporting thereon a moving mechanism 10 for moving the holding table 20 in X-axis directions. The moving mechanism 10 includes a pair of guide rails 11 and 12 mounted on the base 5 and extending parallel to the X-axis directions and a motor-driven movable table 14 slidably disposed on the guide rails 11 and 12. One of the guide rails 11 and 12, i.e., the guide rail 11, has a guide groove 13 of V-shaped cross section defined in an upper surface thereof, and the other guide rail 12 has a flat upper surface. The movable table 14 is supported from below by the guide rails 11 and 12 in a posture parallel to the base 5.

The movable table 14 is of a rectangular shape as viewed in plan and has a straight ridge 15 projecting downwardly from a lower surface thereof near one of its sides. The straight ridge 15 rides in the guide groove 13 in the guide rail 11, whereas the lower surface of the movable table 14 near the other side thereof is placed on the other guide rail 12. A nut 16, depicted in FIG. 2, is disposed on the lower surface of the movable table 14 near the other side thereof and threaded over a feed screw 17 extending parallel to the guide rail 12. The feed screw 17 has an end connected to a drive motor 18 mounted on the base 5. When the drive motor 18 is energized, the feed screw 17 is rotated about its own axis, moving the nut 16 and hence the movable table 14 in one of the X-axis directions along the guide rails 11 and 12.

The movable table 14 has a circular opening 19, depicted in FIG. 2, defined therein. A fracture plate 40 mounted on the base 5 for rupturing the wafer W projects upwardly through the circular opening 19. The fracture plate 40 extends in Y-axis directions perpendicular to the X-axis directions. The fracture plate 40, which will be described in greater detail later, fractures the wafer W by abutting against the lower surface, i.e., the face side, of the wafer W and at the same time applying suction forces to the wafer W. A holding table 20 for holding the wafer W thereon is disposed on the movable table 14 around the circular opening 19 in surrounding relation to the fracture plate 40. The holding table 20 includes a support drum 21 for supporting the holding tape T around the wafer W and a frame holder 22 for holding the ring frame F around the support drum 21.

The holding table 20 also includes an annular flange 23 disposed on a lower portion of the support drum 21 below the frame holder 22. An endless belt 24 is trained around the annular flange 23 and a pulley 26 coupled to the drive shaft of a drive motor 25 mounted on the movable table 14. A plurality of cylinders 27 are mounted on an upper surface of the flange 23 and have respective piston rods coupled to the frame holder 22. When the cylinders 27 are actuated, the frame holder 22 is vertically moved, i.e., lifted or lowered, by the piston rods of the cylinders 27. Four clamps 28 that are angularly spaced from each other are mounted on an outer circumferential surface of the frame holder 22 for securing the ring frame F to the frame holder 22 at four angularly spaced positions. When the drive motor 25 is actuated, the holding table 20 is rotated in its entirety about a Z-axis on the movable table 14 by the pulley 26 and the belt 24.

An alignment image capturing unit such as a camera, not depicted, for capturing an image of the projected dicing lines on the face side of the wafer W is disposed in the support drum 21. The alignment image capturing unit detects the projected dicing lines on the face side of the wafer W through the holding tape T. Based on the detected projected dicing lines, the upper end of the fracture plate 40 is aligned with one of the projected dicing lines on the wafer W. Then, the frame holder 22 is lowered, expanding the holding tape T in its plane, and the fracture plate 40 is moved relatively to the wafer W, dividing the wafer W into individual device chips along the projected dicing line.

Figure 3A:
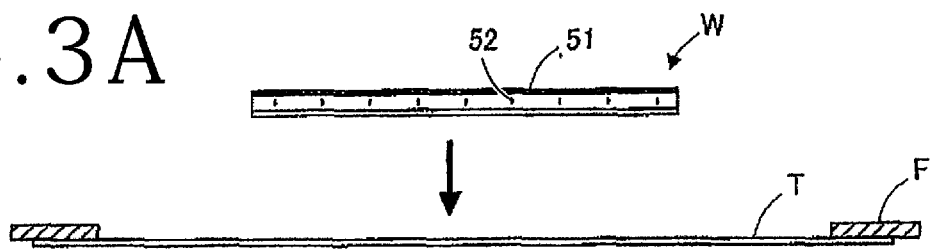
FIGS. 3A through 3C are cross-sectional views illustrating the method of processing a wafer according to the embodiment.

As illustrated in FIG. 3A, the wafer W has a metal film 51 on its reverse side. Such a metal film exists on semiconductor wafers where it produces electrodes on devices or optical device wafers where it produces reflective films on light emitting diodes (LEDs). Since a metal film is ductile or tenacious, when an external force are applied to the wafer W by the fracture plate 40 to divide the wafer W, the metal film 51 on the reverse side of the wafer W may not be appropriately fractured, but is likely to be elongated. As the metal film 51 is elongated under the applied external force, it tends to produce burrs on devices divided from the wafer W, making the devices defective. The wafer processing method according to the present embodiment is aimed at appropriately dividing the wafer W with the metal film 51 thereon.

Figure 4A:
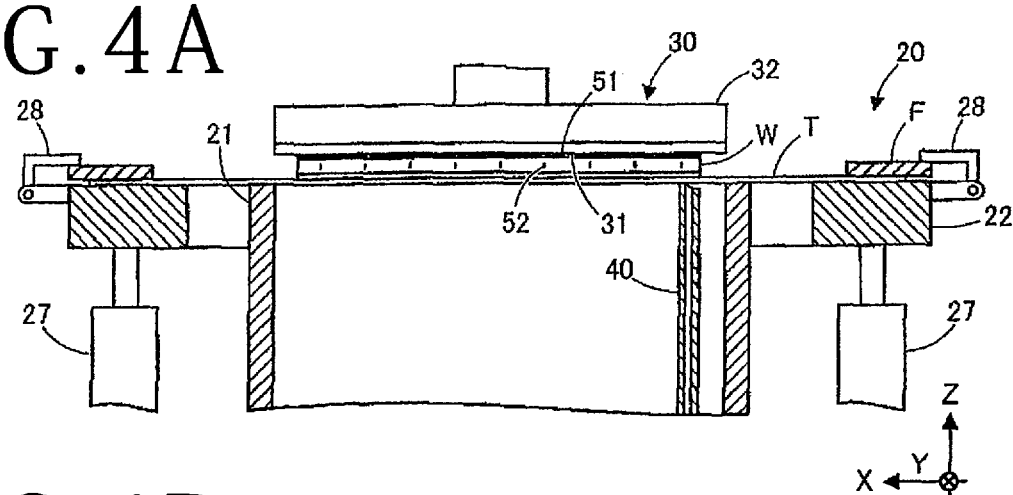
FIGS. 4A through 4C are cross-sectional views illustrating the method of processing a wafer according to the embodiment.
Figure 4B:
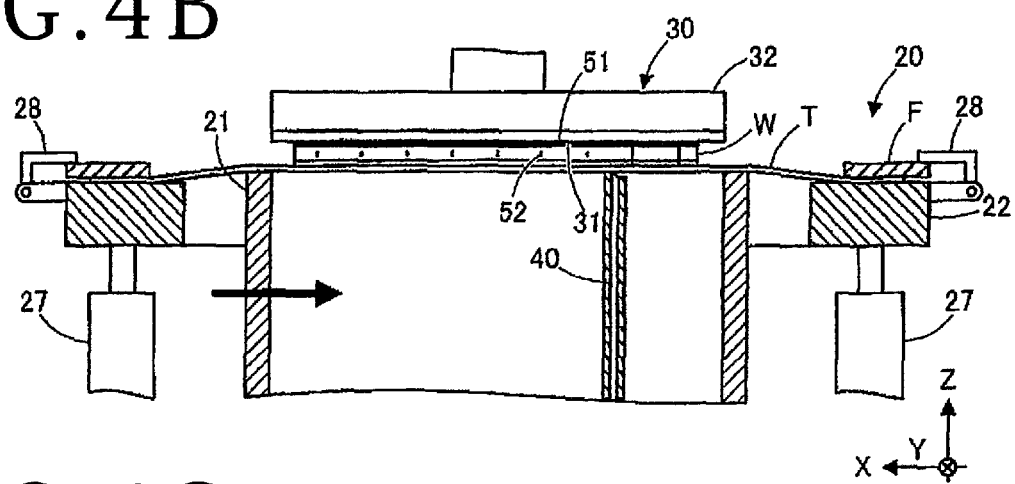
Figure 4C:
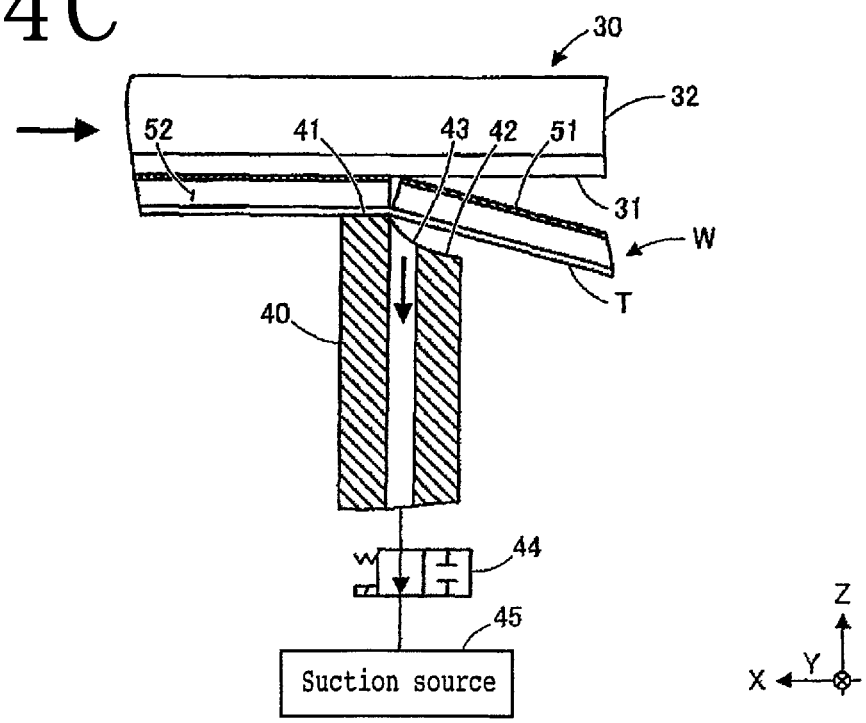

The present embodiment addresses a change in a property of a metal material on account of a change in the temperature thereof. According to the present embodiment, specifically, contact cooling means 30 (see FIGS. 4A through 4C) cools the metal film 51 to or below a ductile-brittle transition temperature, typically 0° C., at which the metal film 51 changes from a ductile state to a brittle state, making the metal film 51 easy to fracture. As illustrated in FIGS. 4A through 4C, the contact cooling means 30 has a contact surface 31 for contacting the entire upper surface of the wafer W, i.e., the entire upper surface of the metal film 51 on the wafer W. The contact surface 31 is cooled to 0° C. or below by a cooling unit 32. Since the entire upper surface of the metal film 51 is cooled 0° C. or below by the contact cooling means 30, the metal film 51 loses its ductility. Therefore, it is possible for the fracture plate 40 to fracture the wafer W and the metal film 51 all together with ease along the projected dicing lines where the mechanical strength of the wafer W is reduced.

The method of processing a wafer using the wafer dividing apparatus 1 will hereinafter be described below with reference to FIGS. 3A through 4C. FIG. 3A illustrates a tape sticking step of the method, FIGS. 3B and 3C illustrate a wafer holding step of the method, and FIGS. 4A through 4C illustrate a wafer fracturing step of the method.

As illustrated in FIG. 3A, the tape sticking step is carried out on the wafer W in which modified layers 52 have been formed along the projected dicing lines by a laser processing process or the like. In the tape sticking step, the holding tape T is stuck to the ring frame F to close the circular central opening defined in the ring frame F, and the face side of the wafer W is stuck to the holding tape T. The holding tape T thus has its outer peripheral edge portion supported on the ring frame F, and the wafer W is positioned within the ring frame F. The wafer W with the metal film 51 exposed in the ring frame F is loaded into the wafer dividing apparatus 1 (see FIG. 1). The tape sticking step may be mechanically performed by a dedicated apparatus or may be manually performed by the operator.

Figure 3B:
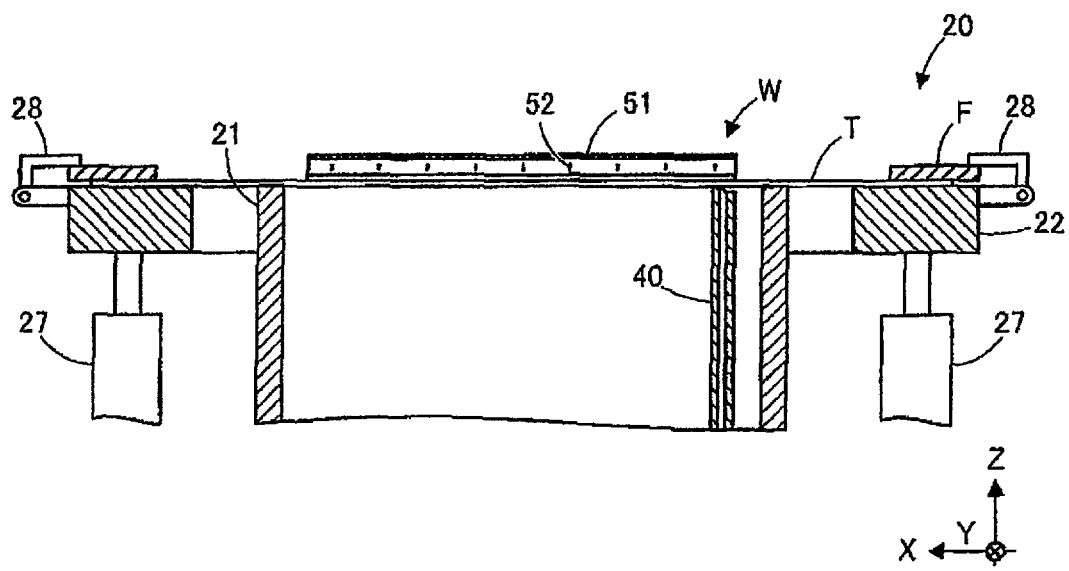
Figure 3C:
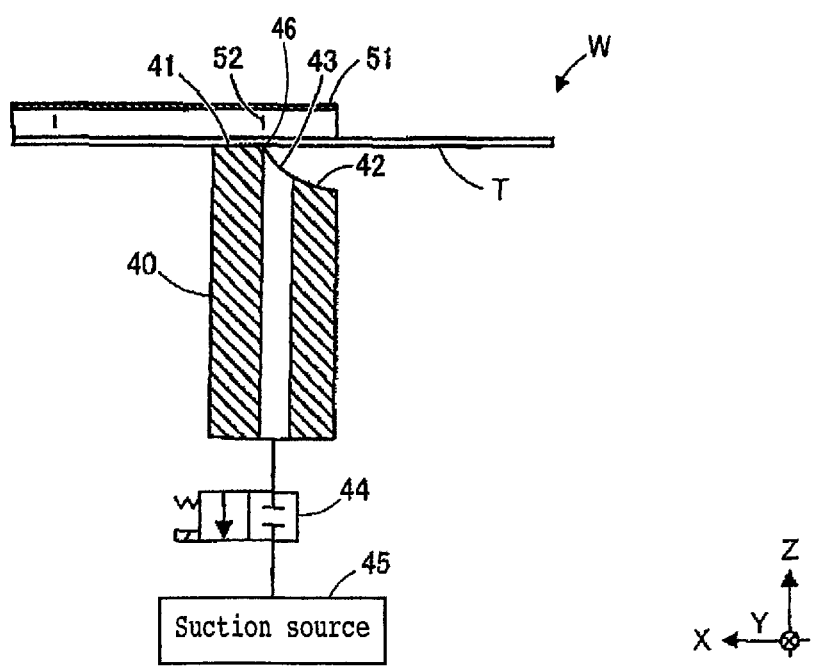

As illustrated in FIG. 3B, the wafer holding step is carried out after the tape sticking step has been carried out. In the wafer holding step, the wafer W is supported on the support drum 21 by the holding tape T, and the ring frame F around the wafer W is held by the frame holder 22. The alignment image capturing unit, not depicted, captures an image of the projected dicing lines on the wafer W. Based on the captured image, the holding table 20 is rotated until the projected dicing lines on the wafer W are aligned with the Y-axis directions. The projected dicing lines on the wafer W are thus adjusted to directions parallel to the fracture plate 40.

The fracture plate 40 has a length larger than the diameter of the wafer W, for example. As illustrated in FIG. 3C, the fracture plate 40 has an upper end held in abutment against the wafer W with the holding tape T interposed therebetween. The fracture plate 40 has on its upper end a flat face 41 held in contact with the holding tape T and a curved face 42 slanted away from the holding tape T. The flat face 41 and the curved face 42 extend longitudinally along the fracture plate 40. The curved face 42 has a slit-like suction port 43 defined therein adjacent to the flat face 41. The suction port 43 is connected through a slot defined vertically in the fracture plate 40 and a valve 44 outside of the fracture plate 40 to a suction source 45. When the suction source 45 is actuated, it develops a negative pressure in the suction port 43, applying an external force to the wafer W through the holding tape T.

As illustrated in FIG. 4A, the wafer holding step is followed by the wafer fracturing step. In the wafer fracturing step, the contact cooling means 30 is positioned above the wafer W by a moving mechanism, not depicted, and the contact surface 31 of the contact cooling means 30 is held in contact with the metal film 51 on the reverse side of the wafer W by the moving mechanism. The cooling unit 32 cools the contact surface 31, which cools the metal film 51 on the reverse side of the wafer W to or below the ductile-brittle transition temperature. The metal film 51 now loses its ductility and develops low-temperature brittleness. The metal film 51 thus changes in property such that it can easily be fractured by an external force applied thereto. At this time, the wafer W can also be easily fractured because of the cooled metal film 51.

As illustrated in FIG. 4B, when the wafer W is cooled, the frame holder 22 is lowered to expand the holding tape T slightly in its plane. The wafer W stuck to the holding tape T now undergoes an external force across each of the modified layers 52 along the projected dicing lines. The valve 44 (see FIG. 4C) is opened to apply a negative pressure from the suction source 45 to the suction port 43, drawing the holding tape T toward the fracture plate 40. Then, the wafer W is moved in one of the X-axis directions with respect to the fracture plate 40 by the movable table 14 (see FIG. 1). Now, a suction force from the suction port 43 is applied to one of the projected dicing lines where the mechanical strength of the wafer W is reduced by the modified layers 52, dividing the wafer W into individual device chips at the projected dicing lines that function as severance initiating points.

More specifically, as illustrated in FIG. 4C, when the modified layer 52 in the wafer W that is aligned with the fracture plate 40 is positioned on an edge 46 of the flat face 41 of the fracture plate 40, a bending stress acts on the modified layer 52 in the wafer W under the suction force from the suction port 43. At this time, the external force produced by the expanded holding tape T also acts on the modified layer 52 in the wafer W. The wafer W now starts to crack at the modified layer 52 functioning as the severance initiating point. The wafer W is then divided along the modified layer 52 when it cracks up to the metal film 51. Since the metal film 51 has developed low-temperature brittleness, the metal film 51 is not elongated but is also fractured due to its brittleness together with the wafer W along the projected dicing line.

As the wafer W is intermittently moved relatively to the fracture plate 40, the wafer W is divided into individual device chips along all the projected dicing lines. When the wafer W has been divided into the individual device chips, the contact cooling means 30 is retracted from the wafer W, and the frame holder 22 is lifted to release the holding tape T from the expanded state. As described above, since the wafer W is divided while the metal film 51 is being cooled, the metal film 51 is not elongated, but is neatly fractured, so that the devices on the device chips divided from the wafer W are prevented from being defective due to burrs which would otherwise be produced by the metal film 51. The contact surface 31 of the contact cooling means 30 may be made of a soft material capable of absorbing shocks applied when the wafer W is divided and the metal film 51 is fractured.

With the wafer dividing method according to the present embodiment, as described above, inasmuch as the entire upper surface of the wafer W, i.e., the entire upper surface of the metal film 51, is cooled by the contact surface 31 of the contact cooling means 30, the metal film 51 on the reverse side of the wafer W loses its ductility and develops low-temperature brittleness. The metal film 51 thus rendered brittle can easily be fractured neatly along the projected dicing lines on the wafer W. When the suction force is applied to the wafer W along the projected dicing lines where the mechanical strength of the wafer W is reduced, the wafer W with the metal film 51 is divided into individual device chips without causing the metal film 51 to produce burrs and hence without making the devices on the device chips defective.

In the present embodiment, the face side of the wafer is oriented as a lower surface, the reverse side of the wafer as an upper surface, and the holding tape is stuck to the lower surface of the wafer. However, the present invention is not limited to such surface definitions. Instead, the face side of the wafer may be oriented as an upper surface, the reverse side of the wafer as a lower surface, and the holding tape may be stuck to the lower surface of the wafer. In other words, the holding tape may be stuck to the metal film on the reverse side of the wafer, and the contact surface of the contact cooling means may be held in contact with the face side of the wafer to cool the metal film on the reverse side of the wafer. According to this alternative, the alignment image capturing unit is disposed above the wafer for capturing an image of the face side of the wafer.

In the present embodiment, the modified layers are formed along the projected dicing lines on the wafer, and the mechanical strength of the wafer is reduced by the modified layers. However, the present invention is not limited to such a wafer structure. Insofar as the wafer has severance initiating points where the mechanical strength of the wafer is reduced along the projected dicing lines, scribed lines may be formed on the wafer as severance initiating points, for example.

In the present embodiment, the wafer is divided by the fracture plate while the holding tape is being expanded. However, the present invention is not limited to such a dividing process. The wafer may be divided under a suction force from the fracture plate without the holding tape being expanded. The suction port of the fracture plate is not limited to a slit-like structure, but may be an array of holes defined in the fracture plate, for example.

In the present embodiment, insofar as the cooling unit of the contact cooling means can cool, through the contact surface, the metal film to or below a ductile-brittle transition temperature at which the metal film changes from a ductile state to a brittle state, the cooling unit may cool the metal film with dry ice or electrically, for example.

In the present embodiment, the holding table is moved with respect to the fracture plate. However, the present invention is not limited to such a structure. Insofar as the fracture plate and the holding table are moved relatively to each other, the fracture plate may be moved with respect to the holding table, for example.

In the present embodiment, the wafer with the metal film is divided by being broken using the fracture plate. However, the present invention is not limited to such a structure. Insofar as the wafer with the metal film is divided while the metal film is being cooled by the contact cooling means, the wafer may be divided by expanding the tape stuck to the wafer while the metal film is being cooled by the contact cooling means, for example.

The wafer may be any of various workpieces including a semiconductor substrate, an inorganic material substrate, a packaged substrate, etc. The semiconductor substrate may be any of various substrates made of silicon, gallium arsenide, gallium nitride, carbide silicon, etc. The inorganic material substrate may be any of various substrates made of sapphire, ceramics, glass, etc. The semiconductor substrate and the inorganic material substrate may have devices formed thereon or may be free of devices formed thereon. The packaged substrate may be any of various substrates including substrates for chip size package (CSP), wafer level chip size package (WLCSP), system in package (SIP), and fan out wafer level package (FOWLP). The packaged substrate may have shields against electromagnetic interference (EMI). Wafers may be made of lithium tantalate, lithium niobate, raw ceramics, and piezoelectric material before or after devices are formed thereon.

While the preferred embodiment of the present invention and the modifications thereof have been illustrated above, the embodiment and the modifications may be combined wholly or partly according to other embodiments.

The present invention is not limited to the embodiment and modifications described above, but many changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the scope of the appended claim should be interpreted as covering all the embodiments falling within the range of the technical idea of the present invention.

As described above, the present invention is advantageous in that a wafer with a metal film can be divided without making devices on the wafer defective, and is particularly effective as a method of processing a wafer to divide the wafer into a plurality of device chips.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a wafer to divide the wafer into individual device chips along a grid of projected dicing lines on a face side of the wafer with a metal film on a reverse side thereof, the wafer having a reduced mechanical strength along the projected dicing lines, the method comprising the steps in sequential order of:

sticking a holding tape to a lower surface of the wafer which is either the face side or the reverse side thereof, the wafer having an upper surface which is either the reverse side or the face side thereof;

holding the wafer with the holding tape stuck thereto, along the projecting dicing lines; and drawing the wafer held by the holding tape under suction along the projected dicing lines; and cooling the wafer by moving a contact surface into direct contact with the upper surface of the wafer and cooling the contact surface to or below 0° C. while the contact surface is held in contact with the upper surface of the wafer; and fracturing the wafer into the individual device chips along the projected dicing lines.

2. The method according to claim 1, wherein fracturing the wafer includes moving the wafer relative to a fracture plate that contacts the wafer along the projected dicing lines.

3. The method according to claim 2, wherein the fracture plate includes a flat face held in contact with the holding tape, and a curved face that extends longitudinally along the fracture plate.

4. The method according to claim 2, wherein cooling the wafer includes moving the contact surface into contact with the metal film on the reverse side of the wafer.

5. A method of processing a wafer to divide the wafer into individual device chips along a grid of projected dicing lines on a face side of the wafer, the method comprising the steps in sequential order of:

applying a metal film to an upper surface of the wafer;

sticking a holding tape to a lower surface of the wafer;

holding the wafer with the holding tape stuck thereto, along the projecting dicing lines;

drawing the wafer held by the holding tape under suction along the projected dicing lines; and cooling the wafer by moving a contact surface into direct contact with the metal film on the upper surface of the wafer and cooling the metal film and the wafer to or below 0° C. while the contact surface is held in contact with the metal film; and fracturing the metal film and the wafer into the individual device chips along the projected dicing lines.

6. The method according to claim 5, wherein fracturing the wafer includes moving the wafer relative to a fracture plate that contacts the wafer along the projected dicing lines.

7. The method according to claim 6, wherein the fracture plate includes a flat face held in contact with the holding tape, and a curved face that extends longitudinally along the fracture plate.

8. The method according to claim 1, wherein cooling the wafer includes a cooling unit having the contact surface, and moving the cooling unit so that the contact surface is in direct contact with the upper surface of the wafer.

* * * * *